(12) United States Patent
Mohapatra et al.

(10) Patent No.: US 11,764,275 B2
(45) Date of Patent: Sep. 19, 2023

(54) INDIUM-CONTAINING FIN OF A TRANSISTOR DEVICE WITH AN INDIUM-RICH CORE

(71) Applicant: Intel Corporation, Santa Clara, CA (US)

(72) Inventors: Chandra S. Mohapatra, Hillsboro, OR (US); Glenn A. Glass, Portland, OR (US); Harold W. Kennel, Portland, OR (US); Anand S. Murthy, Portland, OR (US); Willy Rachmady, Beaverton, OR (US); Gilbert Dewey, Beaverton, OR (US); Sean T. Ma, Portland, OR (US); Matthew V. Metz, Portland, OR (US); Jack T. Kavalieros, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 163 days.

(21) Appl. No.: 16/074,373

(22) PCT Filed: Apr. 1, 2016

(86) PCT No.: PCT/US2016/025729
§ 371 (c)(1),
(2) Date: Jul. 31, 2018

(87) PCT Pub. No.: WO2017/171875
PCT Pub. Date: Oct. 5, 2017

(65) Prior Publication Data
US 2020/0066855 A1 Feb. 27, 2020

(51) Int. Cl.
*H01L 29/417* (2006.01)
*H01L 29/201* (2006.01)
(Continued)

(52) U.S. Cl.
CPC ...... *H01L 29/41791* (2013.01); *H01L 29/201* (2013.01); *H01L 29/66795* (2013.01); *H01L 29/785* (2013.01); *H01L 2029/7858* (2013.01)

(58) Field of Classification Search
CPC ............ H01L 29/41791; H01L 29/201; H01L 29/66795; H01L 29/785; H01L 29/7858; H01L 2029/7858
(Continued)

(56) References Cited

U.S. PATENT DOCUMENTS 8,836,016 B2  9/2014  Wu
9,406,777 B2  8/2016  Lee et al.
(Continued)

FOREIGN PATENT DOCUMENTS

KR  10-2015-0116771  10/2015
WO  WO-2015-147858  10/2015
WO  WO-2016-043769  3/2016

OTHER PUBLICATIONS

International Preliminary Report on Patentability for International Patent Application No. PCT/US2016/025729 dated Oct. 11, 2018, 6 pages.
(Continued)

*Primary Examiner* — Nduka E Ojeh
*Assistant Examiner* — Eric W Jones
(74) *Attorney, Agent, or Firm* — Schwabe, Williamson & Wyatt P.C.

(57) ABSTRACT

An apparatus including a transistor device disposed on a surface of a circuit substrate, the device including a body including opposing sidewalls defining a width dimension and a channel material including indium, the channel material including a profile at a base thereof that promotes indium atom diffusivity changes in the channel material in a direction away from the sidewalls. A method including forming
(Continued)

a transistor device body on a circuit substrate, the transistor device body including opposing sidewalls and including a buffer material and a channel material on the buffer material, the channel material including indium and the buffer material includes a facet that promotes indium atom diffusivity changes in the channel material in a direction away from the sidewalls; and forming a gate stack on the channel material.

20 Claims, 9 Drawing Sheets

(51) Int. Cl.
*H01L 29/66* (2006.01)
*H01L 29/78* (2006.01)

(58) Field of Classification Search
USPC .......................................... 257/365
See application file for complete search history.

(56) References Cited

U.S. PATENT DOCUMENTS

| | | | | |
|---|---|---|---|---|
| 9,466,690 | B1* | 10/2016 | Balakrishnan | .... H01L 29/66522 |
| 2013/0001591 | A1* | 1/2013 | Wu | ................. H01L 21/823821 |
| | | | | 257/77 |
| 2013/0034943 | A1* | 2/2013 | Lochtefeld | ........ H01L 29/66795 |
| | | | | 257/E21.409 |
| 2013/0105860 | A1* | 5/2013 | Lochtefeld | ............ H01L 29/778 |
| | | | | 257/190 |
| 2013/0234147 | A1* | 9/2013 | Wu | .................... H01L 29/66795 |
| | | | | 257/76 |
| 2014/0084387 | A1* | 3/2014 | Dewey | ................ H01L 29/0665 |
| | | | | 257/410 |
| 2014/0264489 | A1* | 9/2014 | Wong | .................... H01L 29/785 |
| | | | | 257/288 |
| 2014/0284726 | A1 | 9/2014 | Lee et al. | |
| 2014/0302658 | A1 | 10/2014 | Adam et al. | |
| 2015/0137266 | A1 | 5/2015 | Huang et al. | |
| 2015/0279947 | A1* | 10/2015 | Waldron | ................ H01L 29/04 |
| | | | | 257/401 |
| 2016/0027780 | A1* | 1/2016 | Mitard | .............. H01L 21/02381 |
| | | | | 257/190 |
| 2016/0126109 | A1* | 5/2016 | Sun | ................... H01L 21/02647 |
| | | | | 257/622 |

OTHER PUBLICATIONS

International Search Report and Written Opinion for International Patent Application No. PCT/US2016/025729 dated Dec. 20, 2016, 9 pgs.
Waldron Niamh et al: "Replacement fin 1-15 processing for III-Von Si: From FinFets to nanowires", Solid State Electronics, Elsevier Science Publishers, Barking, GB, vol. 115, Oct. 23, 2015 (Oct. 23, 2015), pp. 81-91, XP029309681.
Search Report and Written Opinion for European Patent Application No. 16897413.7, dated Oct. 24, 2020, 8 pgs.

* cited by examiner

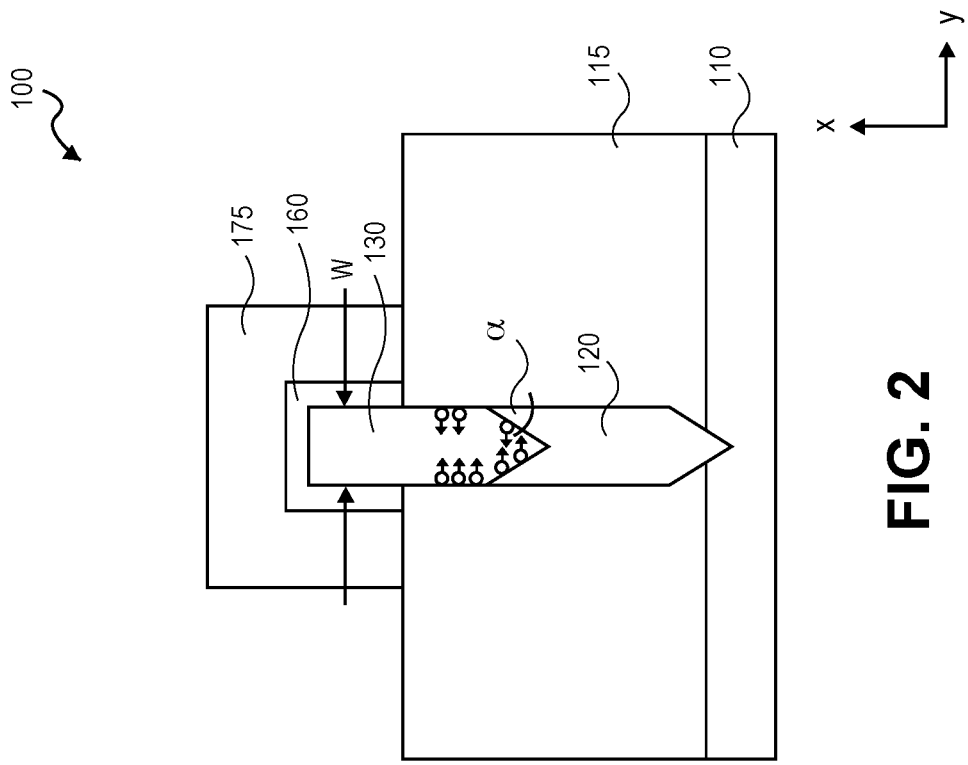
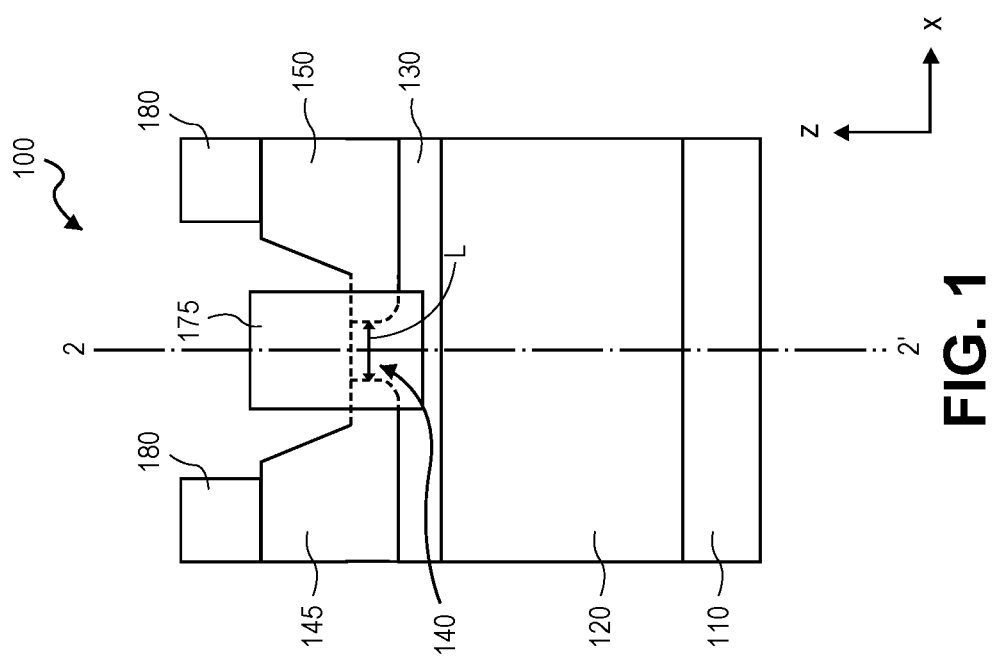

US 11,764,275 B2

INDIUM-CONTAINING FIN OF A TRANSISTOR DEVICE WITH AN INDIUM-RICH CORE

CROSS-REFERENCE TO RELATED APPLICATION

This patent application is a U.S. National Phase Application under 35 U.S.C. § 371 of International Application No. PCT/US2016/025729, filed Apr. 1, 2016, entitled "AN INDIUM-CONTAINING FIN OF A TRANSISTOR DEVICE WITH AN INDIUM-RICH CORE," which designates the United States of America, the entire disclosure of which is hereby incorporated by reference in its entirety and for all purposes.

BACKGROUND

Field

Integrated circuit devices.

Description of Related Art

Group III-V compound materials such as an indium containing group III-V compound material (e.g., indium gallium arsenide (InGaAs)) can have superior electron mobility relative to conventional silicon and hence have potential in high performance electrical devices in integrated circuit manufacture. For multiple, non-planar transistors, as deposited InGaAs in a trench on a group III-V compound material such as gallium arsenide (GaAs) to form an InGaAs fin generally results in a column of indium-rich material at the edges of the fin and Ga-rich material in the core. In order to counter short channel effects and improve electrostatic control, an InGaAs fin often needs to be trimmed to get a thinner body to counter short channel effects and achieve better electrostatic control. As a result, the In-rich edges are removed resulting in an In-poor fin. Such indium-poor InGaAs end-of-line fin having less indium than target which had targeted InGaAs at epi deposition results in degraded mobility and transistor performance.

BRIEF DESCRIPTION OF THE DRAWINGS

FIG. 1 shows a cross-sectional side view of an embodiment of a multi-gate field effect transistor device.

FIG. 2 shows a cross-sectional side view of the structure of FIG. 1 through line 2-2'.

DETAILED DESCRIPTION

Figure 3:
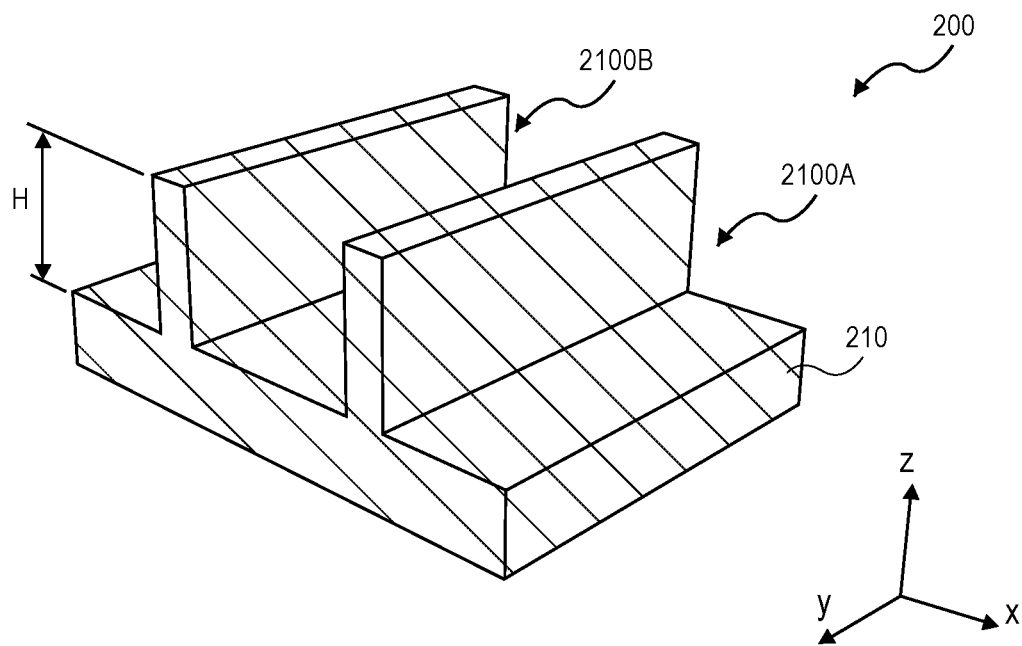
FIG. 3 shows a perspective side view of a substrate that may be any material that may serve as a foundation of which a multi-gate FET may be constructive.

A technique to achieve an In-rich group III-V compound channel material (e.g., InGaAs) at the core of a three-dimensional or nonplanar transistor fin is described. Any trimming of the sidewalls or edges of such an InGaAs fin will not result in a significant depletion of indium in the fin and hence will not impact the mobility and trans-conductance of the end of line device.

FIG. 1 shows a cross-sectional side view of an embodiment of a field effect transistor (FET) device such as a metal oxide semiconductor field effect transistor (MOSFET) device, a tunneling field effect transistor (TFET) device or other FET device. FIG. 2 shows the structure of FIG. 1 through line 2-2'. Referring to FIG. 1 and FIG. 2, device 100 includes substrate 110 that is, for example, a single crystal silicon substrate. Disposed on substrate 110, in this embodiment, is buffer layer 120. Buffer layer 120 contains, for example, a material that has a larger lattice than a material of the substrate (e.g., silicon substrate 110). A suitable material in buffer layer includes but is not limited to germanium (Ge), gallium arsenide (GaAs), gallium phosphide (GaP), gallium arsenide antimony (GaAsSb), indium aluminum arsenide (InAlAs), indium aluminum antimony (In-AlSb), or gallium antimony (GaSb). To reduce a threading dislocation density, a material in buffer layer 120 may be graded with, for example, a material of the underlying substrate (e.g., silicon) to gradually increase a buffer material composition in an epitaxially grown silicon buffer material film such that closer to substrate 110, the buffer material concentration is less and increases away from the substrate. In another embodiment, two different buffer materials may be present in buffer layer 120 such as a first material at the base of the buffer layer and a second material on the first material.

In the embodiment in FIG. 1 and FIG. 2, disposed on buffer layer 120 is intrinsic layer 130. In one embodiment, intrinsic layer 130 is a channel material for the particular transistor device. In one embodiment, intrinsic layer 130 includes a group III-V compound material. In one embodiment, the group III-V compound material includes indium (In) (i.e., has a concentration of indium). An example of a group III-V compound material including indium, particularly for an n-type transistor device is InGaAs.

As illustrated in FIG. 1, disposed in intrinsic layer 130 is junction region 145 and junction region 150. In one embodiment, junction region 145 is a source of a MOSFET (e.g., an $n^+$ source) and junction region 150 is a drain of the MOSFET (e.g., $n^+$ drain). Disposed between junction regions 145 and 150 is channel 140 of a material of intrinsic layer 130 having a length dimension, L of, for example, 10-30 nm.

As illustrated in FIG. 2, in one embodiment, intrinsic layer 130 has a width dimension, W, on the order of 5-20 nm. An interface between buffer layer 120 and intrinsic layer 130 has a profile that promotes atom diffusivity changes, particularly indium atom diffusivity changes, in intrinsic layer 130 in a direction away from the opposing sidewalls defining the width dimension, W. In one embodiment, buffer layer 120 has an inverse {111} facet or other profile such that a center portion of the buffer layer at the interface is at a point closer to substrate 110 than the sidewalls of the buffer layer. In one embodiment, a steep profile is targeted such as an angle, α, of the sidewall and dielectric layer 115 of 20°-50°. Although an inverted triangular profile of buffer layer 120 is shown representative of the inverse {111} facet, in other embodiments, other shapes are contemplated such as an inverted semicircular or arched shaped.

FIG. 2 shows intrinsic layer 130 formed, for example, by an epitaxial growth process on buffer layer 120 and conforming to the profile of the interface (i.e., conforming to the inverted {111} profile of buffer layer 120 at the interface). A result of the inverse faceting of the growth surface of buffer layer 120 is that indium atoms in intrinsic layer 130 will migrate away from the {111} inverse facets and hence, from the sidewalls and toward a center of the body of intrinsic layer 130 in response to diffusivity changes resulting in an indium-rich core, particularly for a device layer of InGaAs, where indium atoms are smaller than gallium atoms and therefore tend to diffuse faster than gallium atoms. Because of the inverse {111} faceting of buffer layer 120, the indium atoms tend to diffuse away from these opposing facets towards the fin core resulting in an indium-rich core. Diffusion of indium atoms away from these opposing inverse-facets would also appear as diffusion away from the opposing sidewalls adjacent dielectric layer 115 (trench isolation); such diffusion away from dielectric material is believed to be merely a consequence of the diffusion away from opposing {111} inverse-facets. FIG. 2 representatively shows atoms diffusing away from opposing {111} inverse facets of intrinsic layer 130 in the fin. Should a body of intrinsic layer 130 be subsequently thinned (e.g., a width, W, of the fin is reduced), such thinning will tend to result in less indium atom loss thus reducing any impact on the mobility/transconductance of the transistor.

Overlying intrinsic layer 130 in channel region 140 is gate dielectric layer 160 of, for example, a silicon dioxide or a dielectric material having a dielectric constant greater than silicon dioxide (a high-k material) or a combination of silicon dioxide and a high-material and a thickness on the order of a few nanometers. Gate dielectric layer 160 conforms to the profile of intrinsic layer 130 along a length dimension of channel region 140 that is representatively shown in this example as rectangular. Disposed on gate dielectric 160 is gate electrode 175 of, for example, an electrically conductive material such as a metal material (e.g., tantalum) or a silicide. For representative purposes, in one embodiment, gate electrode 175 has a total thickness on the order of 50-100 nm and dielectric layer 160 has a thickness of 1-15 nm. Finally, FIG. 1 also shows metal contact 180 to junction region 145 and metal contact 185 to junction region 150. An additional contact may be formed to the gate stack to operate the device.

FIGS. 3-9 describe a process of forming an FET device which is illustrated in FIGS. 1 and 2. FIG. 10 presents a flow chart of the process. FIGS. 3-9 describe a three-dimensional multi-gate FET including a fin comprising a profile at a base thereof that promotes atom diffusivity changes in the channel in a directional way from the sidewalls of the channel body or fin. A formation process for an N-type FET is described. Referring to FIG. 3 and with reference to the flow chart of FIG. 10, the process begins by defining sacrificial fin structures in a substrate material (block 310, FIG. 10). FIG. 3 shows a perspective side view of substrate 210 that may be any material that may serve as a foundation of which a multi-gate FET may be constructed. Representatively, substrate 210 is a portion of a larger substrate such as wafer. In one embodiment, substrate 210 is a semiconductor material such as single crystal silicon. Substrate 210 may be a bulk substrate or, in another embodiment, a semiconductor on insulator (SOI) structure. FIG. 3 shows substrate 210 following a patterning of the substrate to define sacrificial fin 2100A and sacrificial fin 2100B. Sacrificial fins 2100A and 2100B may be formed by a mask and etch process wherein a mask (e.g., a hard mask) is introduced on a surface (superior surface) of substrate 210 to protect areas of the substrate where the sacrificial fins will be defined and to provide openings in non-fin areas. Once the mask is patterned, substrate 210 may be etched to remove material in unprotected areas. A substrate of silicon may be etched with a wet or dry etch. Representatively, a suitable etchant is HF based chemistry. Sacrificial fins 2100A and 2100B are etched to have a height, H, on the order of 100-400 nm.

Figure 4:
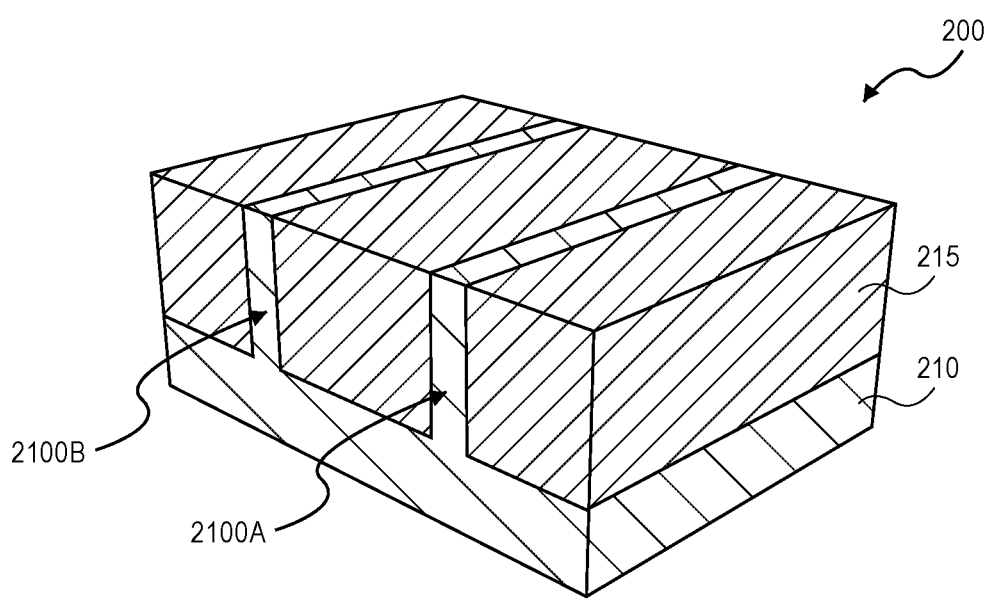
FIG. 4 shows the structure of FIG. 3 following a removal of the mask protecting the fins and the deposition of a trench dielectric layer on the substrate.

FIG. 4 shows the structure of FIG. 3 following a removal of the mask on the fins and following the deposition of a trench dielectric layer on the substrate (block 320, FIG. 10). In one embodiment, dielectric layer 215 is silicon dioxide or a low-k dielectric material. Following deposition of dielectric layer 215, the surface (a superior surface as viewed) of the structure is polished to the level of the top of sacrificial fins 2100A and 2100B so that the fins are exposed.

Figure 5:
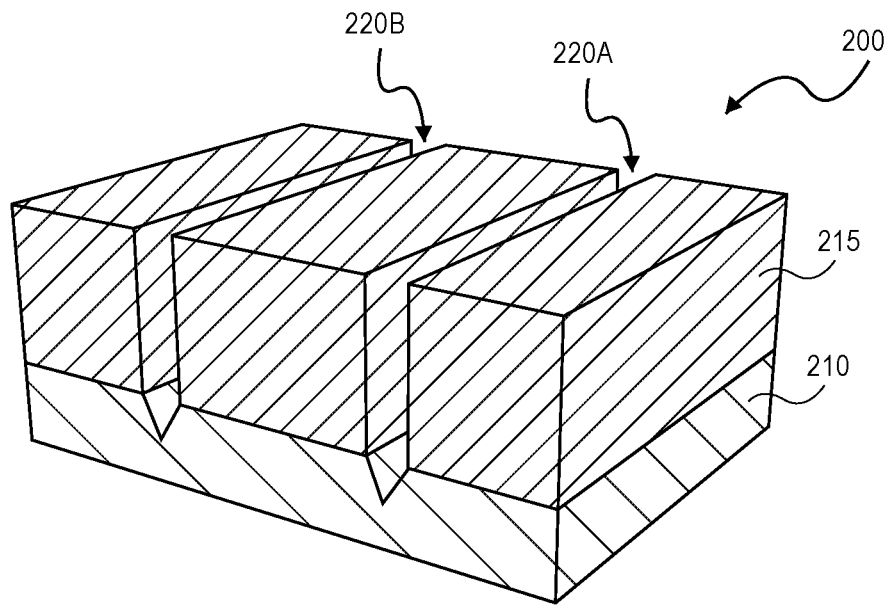
FIG. 5 shows the structure of FIG. 4 following the removal of the sacrificial fins to form trenches of a controlled size and shape.

FIG. 5 shows the structure of FIG. 4 following the removal of sacrificial fins 2100A and 2100B to form trenches of a controlled size and shape (block 330, FIG. 10). The sacrificial fins may be removed by mask and etch process wherein a mask is patterned on a surface of dielectric layer 215 leaving the sacrificial fins exposed followed by an etch process. Sacrificial fins of a silicon material may be etched by a dry or wet etch or a combination of the two. Suitable etchants for etching sacrificial fins of a silicon material include potassium hydroxide (KOH) and tetramethylammonium hydroxide (TMAH). The removal of the sacrificial fins forms trench 220A and trench 220B, respectively. In one embodiment, the etching of the sacrificial fins may be performed to provide a {111} faceting at the bottom of each trench to facilitate a growth of a group III-V compound material in the trenches which is done using TMAH-like or any equivalent chemistry. Alternative geometries are also contemplated.

Figure 6:
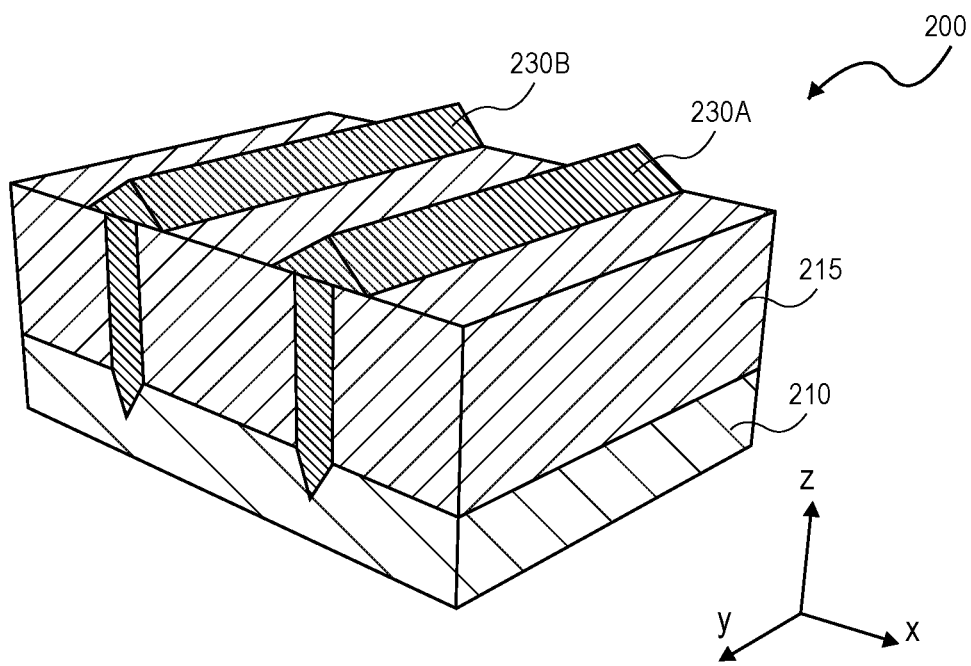
FIG. 6 shows the structure of FIG. 5 following the introduction of a buffer material in the trenches.

FIG. 6 shows the structure of FIG. 5 following the introduction of a buffer material in trenches 220A and 220B (block 340, FIG. 10). In one embodiment, buffer material is a group III-V compound material such as, but not limited to, gallium arsenide (GaAs), indium phosphide (InP); germanium (Ge), gallium phosphide (GaP), gallium arsenide antimony (GaAsSb), indium aluminum arsenide (InAlAs) and gallium antimony (GaSb). The buffer material may be introduced by an epitaxial growth process. In another embodiment, the trenches may be filled with a first buffer of one of the noted materials followed by a second buffer of another of the noted materials. The trench confined growth of a buffer material or materials offer an advantage of aspect ratio trapping (ART) whereby crystalline quality of the epitaxial layer(s) is enhanced through trapping of threading dislocations, stacking faults, twins, etc., at sidewalls of a trench where defects terminate such that overlying layers may be increasingly defect-free. FIG. 6 shows buffer material 230A and buffer material 230B in respective trenches 220A and 220B. The buffer material has a dimension measured in z direction on the order of 100 to 400 nanometers (nm). FIG. 6 shows buffer material 230A and buffer material 230B including {111} faceted overgrowth protruding off the superior plane defined by dielectric layer 215.

Figure 7:
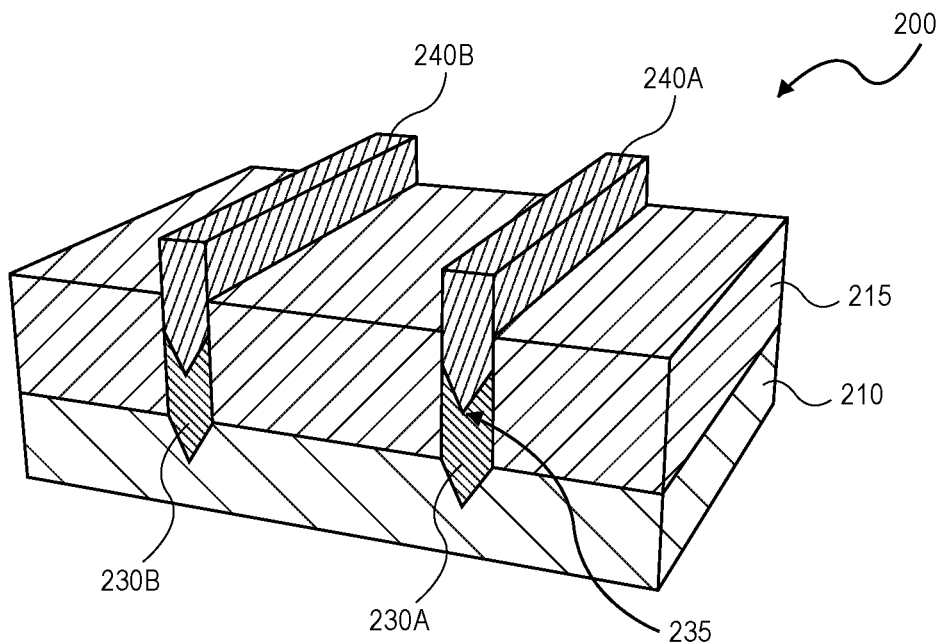
FIG. 7 shows the structure of FIG. 6 following a removal of a portion of the buffer materials in their respective trenches and the introduction of an intrinsic material into the trenches.

FIG. 7 shows the structure of FIG. 6 following a removal of a portion of buffer material 230A and buffer material 230B in their respective trenches and the introduction of an intrinsic material into the trenches. In one embodiment, the removal of buffer material 230A and buffer material 230B is performed by an etch in a manner to create an inverse {111} facet. A suitable etchant for creating an inverse {111} faceted profile in buffer material 230A and buffer material 230B is TMAH or any equivalent chemistry. FIG. 7 shows the inverse {111} faceted profile of buffer material 230A and buffer material 230B (e.g., profile 235) following the removal of buffer material in trenches 220A and 220B. FIG. 7 shows intrinsic layer 240A and intrinsic layer 240B formed on buffer material 230A and buffer material 230B, respectively (block 345, FIG. 10). The intrinsic layers may be epitaxially grown. In one embodiment, intrinsic layer 240A and intrinsic layer 240B are each an indium-containing group III-V compound material that may be lightly doped n-type or p-type to the extent of, for example, e16 atoms per cubic centimeters. In one embodiment, intrinsic layer 240A and intrinsic layer 240B are InGaAs. Intrinsic layer 240A and intrinsic layer 240B have a representative height on the order of 40 nm to 100 nm. FIG. 7 shows the structure following a polish of the intrinsic layer to a plane defined by dielectric layer 215 and after a recession of dielectric layer 215 such that the intrinsic layers are protruding above a plane defined by dielectric layer 215 as fin structures (block 350, FIG. 10).

Figure 8:
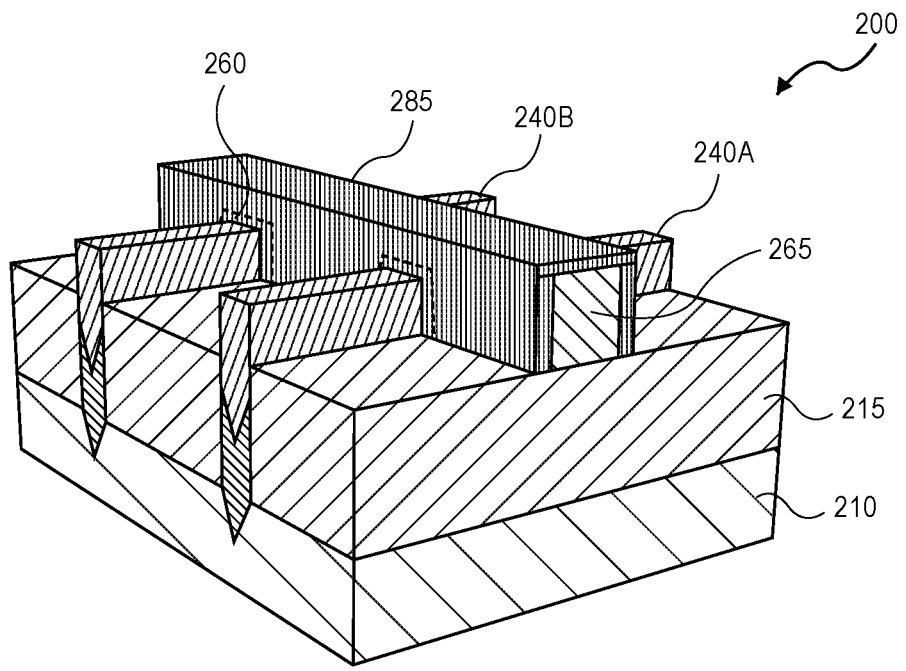
FIG. 8 shows the structure of FIG. 7 following the formation of a sacrificial or dummy gate stack on the fin portion of the intrinsic layers extending above dielectric layer 215.

FIG. 8 shows the structure of FIG. 7 following the formation of a sacrificial or dummy gate stack on the fin portion of intrinsic layer 240A and intrinsic layer 240B extending above dielectric layer 215 (block 360, FIG. 10). In one embodiment, a gate stack includes gate dielectric layer 260 of, for example, silicon dioxide or a high K dielectric material. Disposed on gate dielectric layer 260, in one embodiment, is dummy gate 265 of, for example, polysilicon deposited by, for example, a chemical vapor deposition method. In one embodiment, to form the gate stack, a mass material is introduced over the structure and patterned to have an opening for the gate stack. The gate stack is then introduced in the opening in a typical gate-last process. The gate stack may include a spacer dielectric layer defining spacers 285 on opposite sides thereof.

Figure 9:
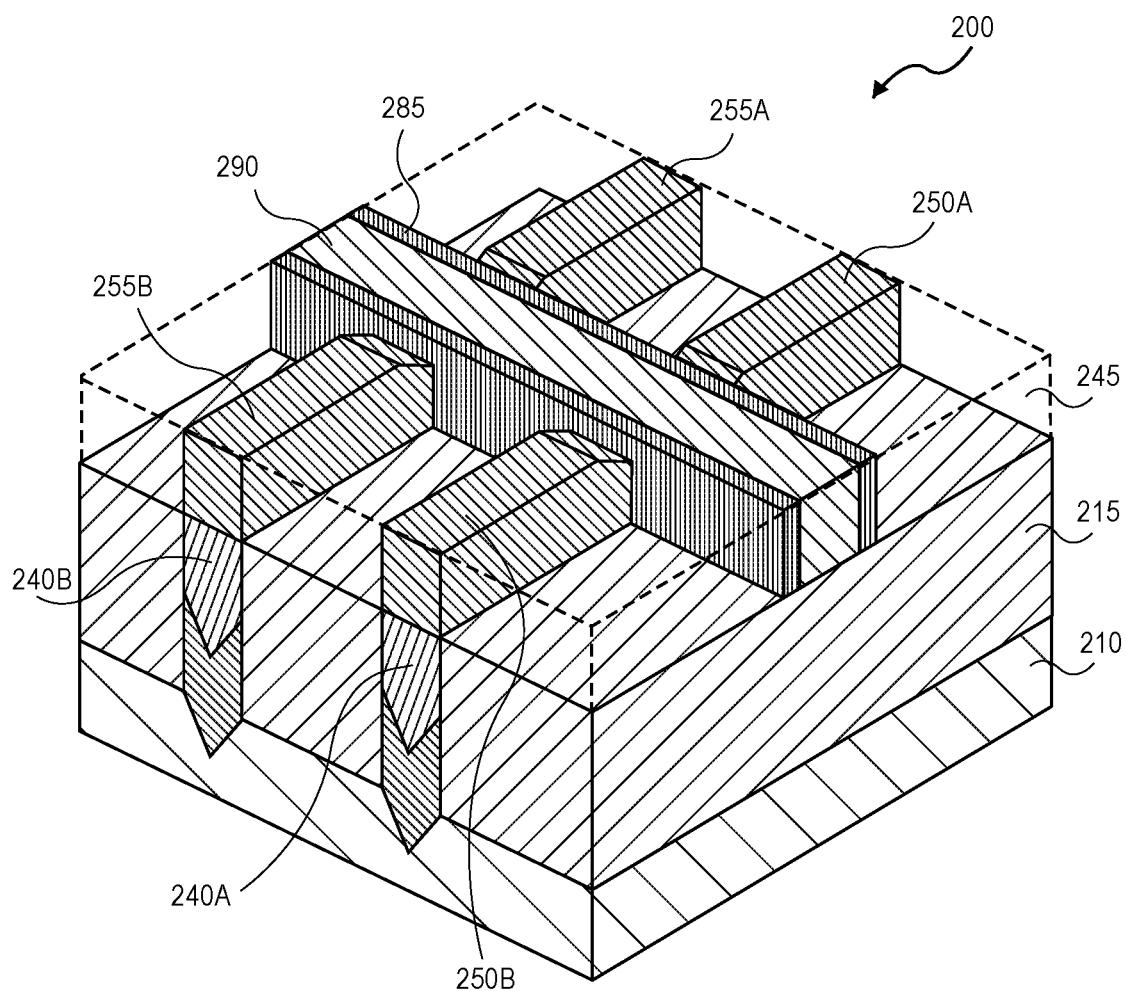
FIG. 9 shows the structure of FIG. 8 following the formation of junction region and a gate stack.
Figure 10:
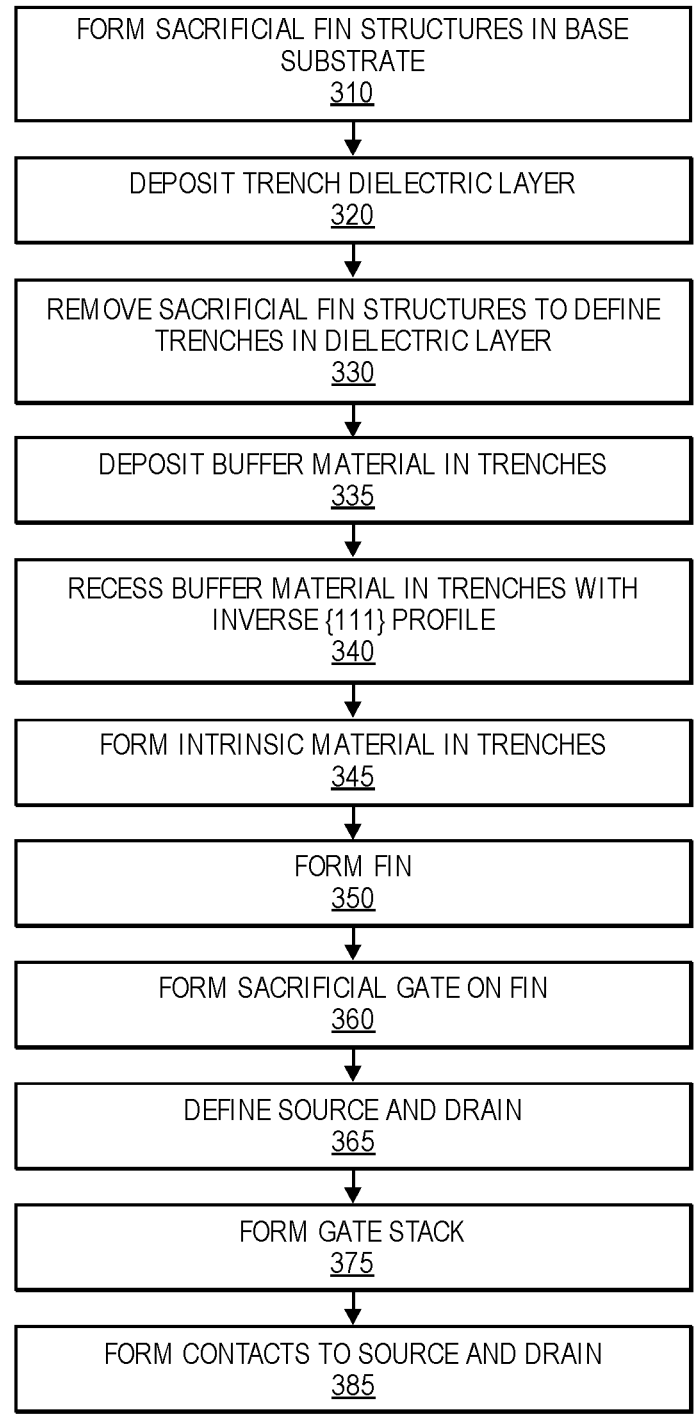
FIG. 10 presents a flow chart of the process.

FIG. 9 shows the structure of FIG. 8 following the formation of junction regions and a gate stack. FIG. 9 shows structure 200 including junction region or source (250A and junction region or drain 250B for one device and source 255A and drain 255B for a second device). Representatively, the junction regions (source and drain) are formed, in one embodiment, by removing portions of intrinsic layer 240A and 240B in designated source and drain regions on the opposite sides of the sacrificial or dummy gate 265 and replaced with a desired source and drain material (block 365, FIG. 10). Representatively, an area of structure 200 may be masked with junction area portions of intrinsic layers 240A and 240B exposed and the intrinsic layer removed in the exposed area. Source and drain materials may then be introduced such as by an epitaxial growth process. In one embodiment, for an n-type device, a suitable material for source 250A/source 255A and drain 250B/drain 255B is Si, Ge or Te doped InAs, InGaAs, InSb etc. In another embodiment, the junction regions may be formed by retention of the fin portion of intrinsic layer 240A and intrinsic layer 240B and the doping of such fin portions or through the introduction of a cladding material on the fin portions.

Following formation of junction regions (source 250A/drain 250B and source 255A/drain 255B), a dielectric material is introduced on the structure (on structure 200 (on a surface including the junction region and sacrificial gate 265)). In one embodiment, the dielectric material silicon dioxide or a low k material or a combination of materials (e.g., multiple low k material of silicon dioxide and one or more low k materials). FIG. 9 shows dielectric material 245 in dashed lines. Sacrificial gate 265 and gate dielectric 260 are then removed and replaced with a gate dielectric followed by a gate electrode (block 385, FIG. 10). FIG. 9 shows the structure including gate electrode 290. Representative materials for a metal gate electrode include tungsten, tantalum, titanium or a nitride, a metal alloy or another material. Following formation of gate electrode 290, contacts may be made to the respective source and drain (and gate electrode 290) to form a device such as shown in FIG. 1 or FIG. 2 (block 385, FIG. 10).

Figure 11:
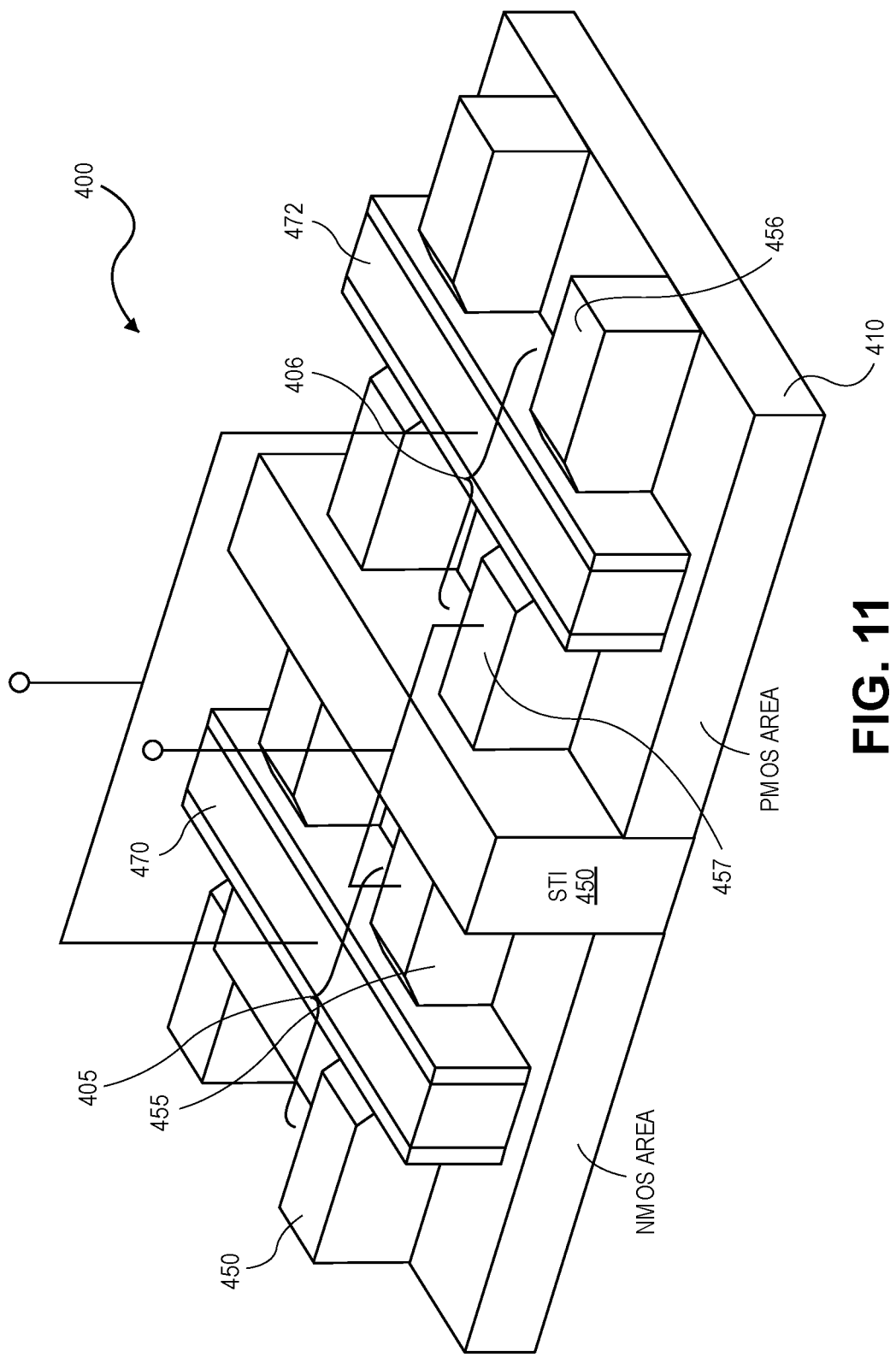
FIG. 11 shows a top side, perspective view of a CMOS inverter.

FIG. 11 shows a top, side perspective view of a CMOS inverter. Inverter 400 includes, in this embodiment, n-channel MOSFET 405 and p-channel MOSFET 406. Each of n-channel MOSFET 405 and p-channel MOSFET 406 is, in this embodiment, a non-planar device. It is appreciated that an inverter could also be formed using non-planar (e.g., multigate, nanowire) devices or a combination of different device types. In the embodiment illustrated in FIG. 9, each of n-channel MOSFET 405 and p-channel MOSFET 406 is formed on substrate 410. Substrate 410 is, for example, a single crystal silicon substrate or a silicon on insulator (SOI) substrate. N-channel MOSFET 405 and p-channel MOSFET 406 are separated by shallow trench isolation (STI) structure 450 of, for example, a dielectric material such as an oxide. In an NMOS area, overlying silicon substrate 410 is a buffer layer or layers and an indium-containing intrinsic layer (e.g., InGaAs) formed into fins such as described above with reference to FIGS. 1 and 2 where the buffer layer of the fins has a profile of an interface with the intrinsic layer that promotes atom diffusivity away from the sidewalls of the fin. In a PMOS area, fins may be formed of a buffer layer and an intrinsic layer of, for example, germanium or a group III-V compound material such as indium gallium antimony (InGaSb). Formed in the NMOS area is n-channel MOSFET 405 that includes gate electrode 470 and appropriately doped (e.g., silicon-doped) source 450 and drain 455. Gate electrode 470 is disposed on a channel region of the transistor that is formed from the intrinsic layer. Gate electrode 470 is separated from the channel region by a gate dielectric disposed therebetween of, for example, silicon dioxide or a high-k dielectric material or a combination of the two. Formed in PMOS area is p-channel MOSFET 406 includes gate electrode 470 and source 456 and drain 457 appropriately doped or constituting p-type material. In one embodiment, source 456 and drain 457 are a germanium material. Gate electrode 470 is disposed on a channel region of the transistor. Gate electrode 470 is separated from the channel by a gate dielectric such as silicon dioxide or a high-k dielectric material or a combination of the two. CMOS inverter 400 is formed by the connection of drain 455 of n-channel MOSFET 405 to drain 457 of p-channel MOSFET 406 and the connection of each gate electrode as illustrated.

Figure 12:
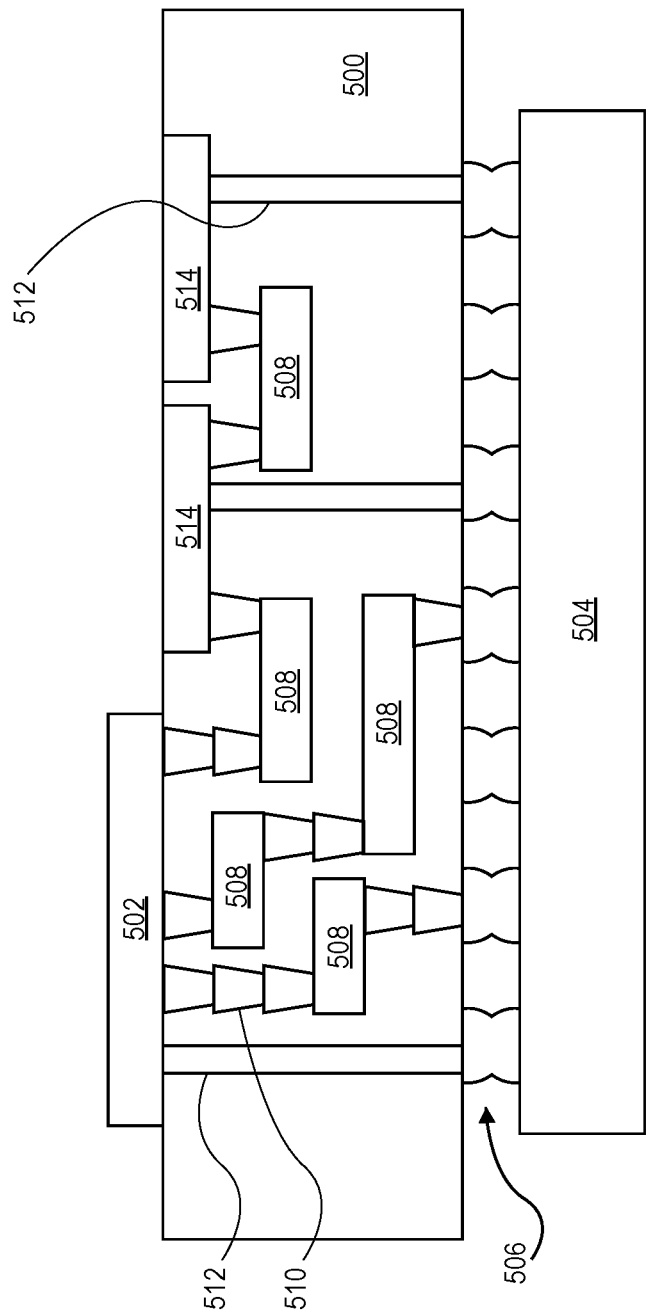
FIG. 12 is an interposer implementing one or more embodiments.

FIG. 12 illustrates interposer 500 that includes one or more embodiments. Interposer 500 is an intervening substrate used to bridge a first substrate 502 to second substrate 504. First substrate 502 may be, for instance, an integrated circuit die including multigate transistor devices of the type described above. Second substrate 504 may be, for instance, a memory module, a computer motherboard, or another integrated circuit die. Generally, the purpose of interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of interposer 500. In other embodiments, the first and second substrates 502/504 are attached to the same side of interposer 500. In further embodiments, three or more substrates are interconnected by way of interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 500.

Figure 13:
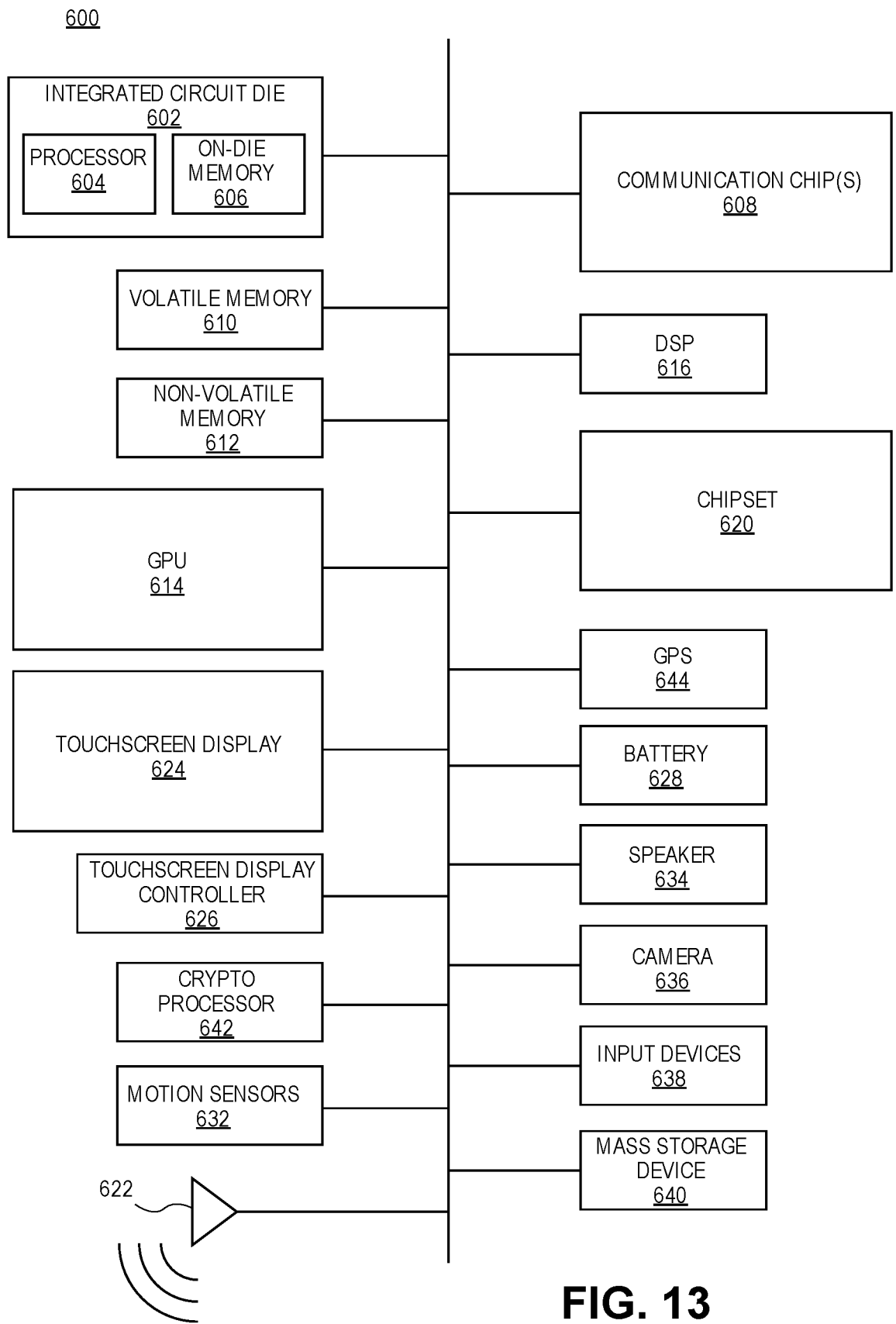
FIG. 13 illustrates an embodiment of a computing device.

FIG. 13 illustrates computing device 600 in accordance with one embodiment. Computing device 600 may include a number of components. In one embodiment, these components are attached to one or more motherboards. In an alternate embodiment, these components are fabricated onto a single system-on-a-chip (SoC) die rather than a motherboard. The components in computing device 600 include, but are not limited to, integrated circuit die 602 and at least one communication chip 608. In some implementations the communication chip 608 is fabricated as part of integrated circuit die 602. Integrated circuit die 602 may include CPU 604 as well as on-die memory 606, often used as cache memory, that can be provided by technologies such as embedded DRAM (eDRAM) or spin-transfer torque memory (STTM or STTM-RAM).

Computing device 600 may include other components that may or may not be physically and electrically coupled to the motherboard or fabricated within an SoC die. These other components include, but are not limited to, volatile memory 610 (e.g., DRAM), non-volatile memory 612 (e.g., ROM or flash memory), graphics processing unit 614 (GPU), digital signal processor 616, crypto processor 642 (a specialized processor that executes cryptographic algorithms within hardware), chipset 620, antenna 622, display or touchscreen display 624, touchscreen controller 626, battery 628 or other power source, a power amplifier (not shown), global positioning system (GPS) device 644, compass 630, motion coprocessor or sensors 632 (that may include an accelerometer, a gyroscope, and a compass), speaker 634, camera 636, user input devices 638 (such as a keyboard, mouse, stylus, and touchpad), and mass storage device 640 (such as hard disk drive, compact disk (CD), digital versatile disk (DVD), and so forth).

Communications chip 608 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 608 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 608. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 604 of computing device 600 includes one or more devices, such as multigate transistors, that are formed in accordance with embodiments described above. The term "processor" may refer to any device or portion of a device that processes electronic data from registers and/or memory to transform that electronic data into other electronic data that may be stored in registers and/or memory.

Communication chip 608 may also include one or more devices, such as transistors, that are formed in accordance with embodiments.

In further embodiments, another component housed within computing device 600 may contain one or more devices, such as multigate transistors, that are formed in accordance with implementations.

In various embodiments, computing device 600 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

EXAMPLES

The following examples pertain to embodiments:

Example 1 is an apparatus including a transistor device disposed on a surface of a circuit substrate, the device including a body including opposing sidewalls defining a width dimension and a channel material including indium, the channel material including a profile at a base thereof that promotes indium atom diffusivity changes in the channel material in a direction away from the sidewalls.

In Example 2, the channel material in the apparatus of Example 1 is a Group III to Group V compound material.

In Example 3, the channel material in the apparatus of Example 2 includes indium-gallium-arsenide.

In Example 4, the channel material in the apparatus of Examples 1-3 is disposed on a buffer material including a facet at an interface with the channel material that promotes indium atom diffusivity changes in the channel material in a direction away from the sidewalls.

In Example 5, the buffer material in the apparatus of Example 4 includes germanium or a Group III to Group V compound material that is different than the channel material.

In Example 6, the facet in the apparatus of Example 4 includes an inverse {111} facet.

In Example 7, the apparatus of any of Examples 1-6 further includes a gate stack on the channel material, the gate stack including a gate electrode and a gate dielectric material wherein the gate dielectric material is disposed between the channel material and the gate electrode.

In Example 8, the gate stack in the apparatus of Example 7 surrounds the channel material in a Gate All Around (GAA) architecture.

Example 9 is a method including forming a transistor device body on a circuit substrate, the transistor device body including opposing sidewalls and including a buffer material and a channel material on the buffer material, the channel material including indium and the buffer material includes a facet that promotes indium atom diffusivity changes in the channel material in a direction away from the sidewalls; and forming a gate stack on the channel material.

In Example 10, prior to forming the body in the method of Example 9, the method includes forming trenches in a dielectric layer on the substrate and forming the body includes forming the buffer material and the channel material in the trenches.

In Example 11, prior to forming the channel material in the method of Example 10, the method includes etching the buffer material to form the facet.

In Example 12, prior to forming the gate stack in the method of Example 10, the method includes recessing the dielectric layer to expose opposing sidewalls of the channel material.

In Example 13, the channel material in the method of any of Examples 9-12 is a Group III to Group V compound semiconductor material.

In Example 14, the channel material in the method of Example 13 includes indium-gallium-arsenide.

In Example 15, the facet in the method of any of Examples 9-14 is an inverse {111} facet.

In Example 16, prior to forming the gate stack in the method of any of Examples 9-14 the method includes removing the buffer material and forming the gate stack includes forming the gate stack around the channel material.

Example 17 is a system including a computer including a processor coupled to a printed circuit board, the processor including transistor device circuitry in which a non-planar transistor device includes a body including opposing sidewalls defining a width dimension and a channel material including indium, the channel material including a profile at a base thereof that promotes indium atom diffusivity changes in the channel material in a direction away from the sidewalls.

In Example 18, the channel material of the transistor device in the system of Example 17 is a Group III to Group V compound material.

In Example 19, the channel material in the system of Example 18 includes indium-gallium-arsenide.

In Example 20, the channel material in the system of any of Examples 17-20 is disposed on a buffer material including a facet at an interface with the channel material that promotes indium atom diffusivity changes in the channel material in a direction away from the sidewalls.

In Example 21, the facet in the system of Example 20 includes an inverse {111} facet.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a transistor device disposed on a surface of a circuit substrate, the device comprising a body comprising opposing sidewalls defining a width dimension and a channel material comprising indium, the channel material comprising a profile at a base thereof, the profile having a center portion closer to the surface of the circuit substrate than sidewalls of the profile, wherein the profile promotes indium atom diffusivity changes in the channel material in a direction away from the sidewalls of the body, wherein the center portion of the profile is within a trench in a dielectric layer, the dielectric layer directly on the surface of the circuit substrate, and wherein the channel material is directly on a buffer material, the buffer material having a bottom profile with a center portion closer to the surface of the circuit substrate than sidewalls of the bottom profile, wherein the bottom profile has a bottommost surface below a bottommost surface of the dielectric layer, and wherein the circuit substrate has an uppermost surface below the bottommost surface of the dielectric layer, the device further comprising a gate stack on a portion of the channel material, and the transistor device comprising epitaxial source or drain structures on either side of the gate stack, the epitaxial source or drain structures on the channel material and laterally adjacent to the portion of the channel material, and the epitaxial source or drain structures separate and distinct from the channel material and comprising a semiconductor material different than the channel material.

2. The apparatus of claim 1, wherein the channel material is a Group III to Group V compound material.

3. The apparatus of claim 2, wherein the channel material comprises indium-gallium-arsenide.

4. The apparatus of claim 1, wherein the buffer material comprises a facet at an interface with the channel material that promotes indium atom diffusivity changes in the channel material in a direction away from the sidewalls.

5. The apparatus of claim 4, wherein the buffer material comprises germanium or a Group III to Group V compound material that is different than the channel material.

6. The apparatus of claim 4, wherein the facet comprises an inverse {111} facet.

7. The apparatus of claim 1, wherein the gate stack comprises a gate electrode and a gate dielectric material wherein the gate dielectric material is disposed between the portion of the channel material and the gate electrode.

8. The apparatus of claim 7, wherein the gate stack surrounds the channel material in a Gate All Around (GAA) architecture.

9. A method comprising:
forming a transistor device body on a circuit substrate, the transistor device body comprising opposing sidewalls and comprising a buffer material and a channel material on the buffer material, the channel material comprising indium, and the channel material comprising a profile at a base thereof, the profile having a center portion closer to the circuit substrate than sidewalls of the profile, and the buffer material comprises a facet that promotes indium atom diffusivity changes in the channel material in a direction away from the sidewalls of the body, wherein the center portion of the profile is within a trench in a dielectric layer, the dielectric layer directly on the circuit substrate, and the buffer material having a bottom profile with a center portion closer to the surface of the circuit substrate than sidewalls of the bottom profile, wherein the bottom profile has a bottommost surface below a bottommost surface of the dielectric layer, and wherein the circuit substrate has an uppermost surface below the bottommost surface of the dielectric layer;

forming a gate stack on a portion of the channel material; and forming epitaxial source or drain structures on either side of the gate stack, the epitaxial source or drain structures on the channel material and laterally adjacent to the portion of the channel material, and the epitaxial source or drain structures separate and distinct from the channel material and comprising a semiconductor material different than the channel material.

10. The method of claim 9, wherein prior to forming the channel material, etching the buffer material to form the facet.

11. The method of claim 9, wherein prior to forming the gate stack, the method comprises recessing the dielectric layer to expose opposing sidewalls of the channel material.

12. The method of claim 9, wherein the channel material is a Group III to Group V compound semiconductor material.

13. The method of claim 12, wherein the channel material comprises indium-gallium-arsenide.

14. The method of claim 9, wherein the facet is an inverse {111} facet.

15. The method of claim 9, wherein prior to forming the gate stack the method comprises removing the buffer material and forming the gate stack comprises forming the gate stack around the channel material.

16. A system comprising:

a computer comprising a processor coupled to a printed circuit board, the processor comprising transistor device circuitry in which a non-planar transistor device comprises a body comprising opposing sidewalls defining a width dimension and a channel material comprising indium, the channel material comprising a profile at a base thereof, the profile having a center portion closer to the surface of the circuit substrate than sidewalls of the profile, wherein the profile promotes indium atom diffusivity changes in the channel material in a direction away from the sidewalls of the body, wherein the center portion of the profile is within a trench in a dielectric layer, the dielectric layer directly on the surface of the circuit substrate, and wherein the channel material is directly on a buffer material, the buffer material having a bottom profile with a center portion closer to the surface of the circuit substrate than sidewalls of the bottom profile, wherein the bottom profile has a bottommost surface below a bottommost surface of the dielectric layer, and wherein the circuit substrate has an uppermost surface below the bottommost surface of the dielectric layer, the non-planar transistor device further comprising a gate stack on a portion of the channel material, and the device comprising epitaxial source or drain structures on either side of the gate stack, the epitaxial source or drain structures on the channel material and laterally adjacent to the portion of the channel material, and the epitaxial source or drain structures separate and distinct from the channel material and comprising a semiconductor material different than the channel material.

17. The system of claim 16, wherein the channel material of the transistor device is a Group III to Group V compound material.

18. The system of claim 17, wherein the channel material comprises indium-gallium-arsenide.

19. The system of claim 16, wherein the buffer material comprises a facet at an interface with the channel material that promotes indium atom diffusivity changes in the channel material in a direction away from the sidewalls.

20. The system of claim 19, wherein the facet comprises an inverse {111} facet.

* * * * *